Nov. 23, 1965 R. D. BRAND 3,219,933

TELEVISION TUNER SWITCHING SYSTEM

Filed Oct. 16, 1962 3 Sheets-Sheet 1

INVENTOR.
ROBERT D. BRAND
BY
Eugene M. Whitacre
Attorney

Nov. 23, 1965 R. D. BRAND 3,219,933

TELEVISION TUNER SWITCHING SYSTEM

Filed Oct. 16, 1962 3 Sheets-Sheet 2

INVENTOR.
ROBERT D. BRAND
BY Eugene M. Whitacre
Attorney

Nov. 23, 1965 R. D. BRAND 3,219,933

TELEVISION TUNER SWITCHING SYSTEM

Filed Oct. 16, 1962 3 Sheets-Sheet 3

INVENTOR.
ROBERT D. BRAND
BY Eugene M. Whitacre
Attorney

United States Patent Office 3,219,933
Patented Nov. 23, 1965

3,219,933
TELEVISION TUNER SWITCHING SYSTEM
Robert D. Brand, Lawrence, Ind., assignor to Radio Corporation of America, a corporation of Delaware
Filed Oct. 16, 1962, Ser. No. 230,844
16 Claims. (Cl. 325—459)

The present invention relates to tuning systems for television receivers of the type wherein a higher-frequency tuner is combined with a lower-frequency tuner to cover two television broadcast signal bands, such as the present very-high-frequency and ultra-high-frequency (VHF and UHF) bands.

In television receivers adapted to receive both VHF and UHF broadcasts, the VHF tuner is generally of the rotary channel-tuning type movable progressively through a plurality of detent-controlled, angularly-spaced, channel-tuning stop positions, and covering, for example, the twelve signal channels of the present VHF band. The associated UHF tuner is generally of the rotary continuous-tuning or variable type covering the seventy signal channels of the present high-frequency UHF band.

More particularly, the present invention relates to tuner switching systems for television receivers of the above type whereby the lower-frequency tuner may operate as an amplifier in connection with the higher-frequency tuner when tuning to the higher-band signal channels.

In commercial VHF-UHF television receivers, it is considered desirable, and present practice, to use the VHF tuner as an additional IF amplifier when operating in the UHF band, for added signal gain and selectivity. For this purpose, the VHF tuner is generally provided with an additional stop position in the VHF channel selecting sequence, at which the internal circuits are connected for UHF-IF signal amplification. Only one position is thus provided on the VHF tuner for UHF reception. This practice thus requires that the VHF tuner be switched or moved to its UHF or IF amplifier position and remain there while the UHF signal channels are tuned separately on the UHF tuner.

In the actual operation of any television receiver there are often many unused VHF tuner stop positions due to the lack of broadcast coverage of all channels in any one television broadcast area. In one Atlantic Coast large metropolitan area, for example, only channels 3, 6, 8 and 10 are currently available at good signal levels for brroadcast reception in the VHF band. This is typical of many television broadcast areas.

For the above reasons, and for certain applications such as remote control tuning, it is desirable that the VHF tuner be capable of being switched to provide an effective means, such as an IF amplifier, for UHF signal translation at any channel tuning or stop position in its rotary movement, thus providing for utilizing any or all normally unused VHF channel tuning stop positions for UHF reception.

It is, therefore, an object of this invention to provide an improved step-tuned lower frequency-band tuner with a switch-in amplifier or like signal translating circuit and control means for use jointly with a higher frequency-band tuner in a two-band television receiver, wherein at any channel tuning setting or stop position, the lower frequency-band tuner may be switched to provide an amplifying or like signal-translating function for any channel signal pre-selected on the higher frequency-band tuner.

It is also an object of this invention to provide an improved rotary VHF channel tuner for a combined VHF-UHF television receiver having circuit elements and two-position switching means operable to convert the tuner for IF signal amplification at any or any number of tuning stop positions in response to tuning movement thereto.

It is a further object of this invention to provide an improved tuner switching system for a combined VHF-UHF television receiver with a rotary channel-selecting VHF tuner of the type having a plurality of detent-controlled, angularly-spaced, channel-tuning stop positions, and programming control means for interposing pre-selected UHF signals at selected VHF tuning stop positions in the VHF channel tuning sequence.

It is also a further object of this invention to provide an improved television tuner switching system for VHF-UHF operation, wherein a rotary VHF channel tuner having a plurality of tuning stop positions is further provided with means for adapting the tuner for IF amplifier operation and for selecting this function or operation at each or any channel tuning stop position.

It is a still further object of this invention to provide an improved tuner switching system for use in conjunction with a rotary VHF channel tuner in a VHF-UHF television receiver wherein at any or all VHF channel tuning stop positions, the VHF tuner may be switched to provide UHF signal translation, such as an IF or like amplifying function, for the UHF tuner, thereby to permit utilization of otherwise unused or inactive VHF channel tuning stop positions for UHF signal reception, and greatly simplifying the tuning set-up and operation of the receiver.

In this system, therefore, each of the present twelve VHF or any number of channel tuning stop positions can be programmed or set to provide for normal VHF channel tuning or UHF (IF amplifier) signal translation in any number of channels. The UHF tuner is connected with the receiver IF amplifier, and remainder of the signal translating circuits, through the VHF tuner and the tuner switching means for operation at preset UHF channels in the VHF tuning sequence.

In accordance with one embodiment of the invention, a VHF tuner of the rotary channel-tuning type is provided with detent means for establishing the desired channel stop positions in a full rotation of the tuning shaft of the tuner, and rotary switching means and circuits for adjusting the tuner for multichannel reception in the VHF band, such as for the twelve channels normally provided. The associated UHF tuner, provided with an operating element such as a movable tuning lever or arm, is arranged to be tuned in unison with the VHF tuner and to predetermined stop positions as established by the detent means in the VHF tuner.

For thi purpose a rotary tuning control turret, having a plurality of channel tuning elements or screws, is mounted on or driven by the VHF tuner shaft, the tuning screws being individually adjustable to actuate the movable tuning lever or element of the VHF tuner at each of the successive stop positions for preset response to desired UHF signal channels.

Within the VHF amplifier, a two-position switching circuit is provided to select either the alternative IF amplifier operation or the normal VHF channel tuning for each tuning stop position. The selection of the desired function or operation at each stop position may be pre-set or programmed by suitable actuating means for the two-position switching circuit. The switching circuit may thus include a mechanical operating element external to the tuner for control by suitable programming means responsive to rotation of the tuning turret and/or the VHF tuner. Each of the twelve VHF channel tuning stop positions in a full rotation of the VHF tuner shaft can thus be programmed for normal VHF channel tuning, or IF amplification for UHF tuning or other purposes. All twelve VHF channels, any number of UHF channels, or a combination of UHF and VHF channels, may thus be set up for selective pre-set tuning by this system.

The switching means incorporated in the VHF tuner may have any suitable configuration. However, sliding-contact and rotary-sector types are presently preferred for this operation. The circuit switching may also be greatly simplified and limited to a minimum number of switch elements ganged or otherwise connected for unitary operation by a single cam or lever arm in conjunction with co-operating selector means for the normal VHF tuning or the alternative IF amplifier operation at each of the channel or tuning stop positions of the VHF tuner.

The invention will, however, be better understood from the following description of certain embodiments thereof, when considered in connection with the accompanying drawings, and its scope is pointed out in the appended claims.

Figure 1:
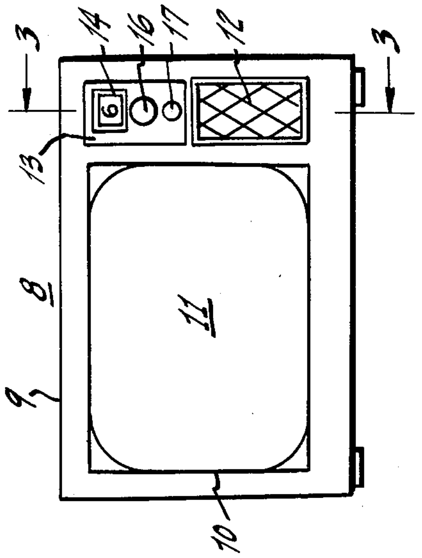
FIGURE 1 is the front view of a combined VHF-UHF television receiver provided with a tuner switching system embodying the invention.

Referring to the drawings, wherein like elements and circuits are designated by like reference characters throughout the various figures and referring particularly to FIGURE 1, a combined VHF-UHF television receiver 8, embodying the invention, may be of any suitable type, such as a table model shown, having a casing 9 in which is located the usual frontal viewing opening or window 10 for the face of a kinescope or picture tube 11, together with a grilled loud-speaker opening 12 and a metallic or like operating panel 13. The latter includes an escutcheon 14 which provides a tuning indicator window through which the channel selection or tuning setting of the receiver may be observed as indicated, being that of VHF channel 6 in the present example.

The operating panel 13 also includes a rotatable VHF channel tuning selector knob or control element 16 and a second UHF channel tuning control knob or element 17, as shown. Both knobs are connected with the internal operating mechanism of the tuning system as will hereinafter be described.

Figure 2:
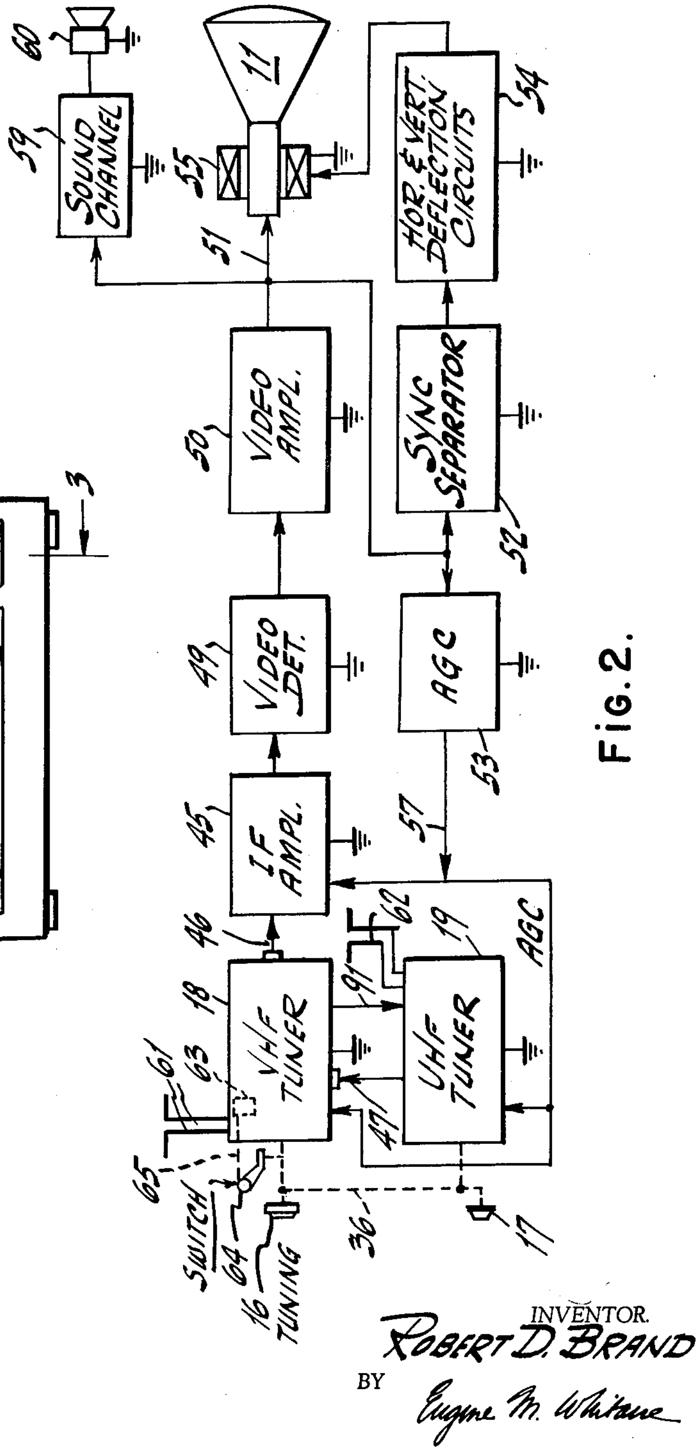
FIGURE 2 is a schematic circuit diagram, in block form, of the television receiver of FIGURE 1 showing the operating elements and circuit connections therefor.
Figures 3, 4, 5:
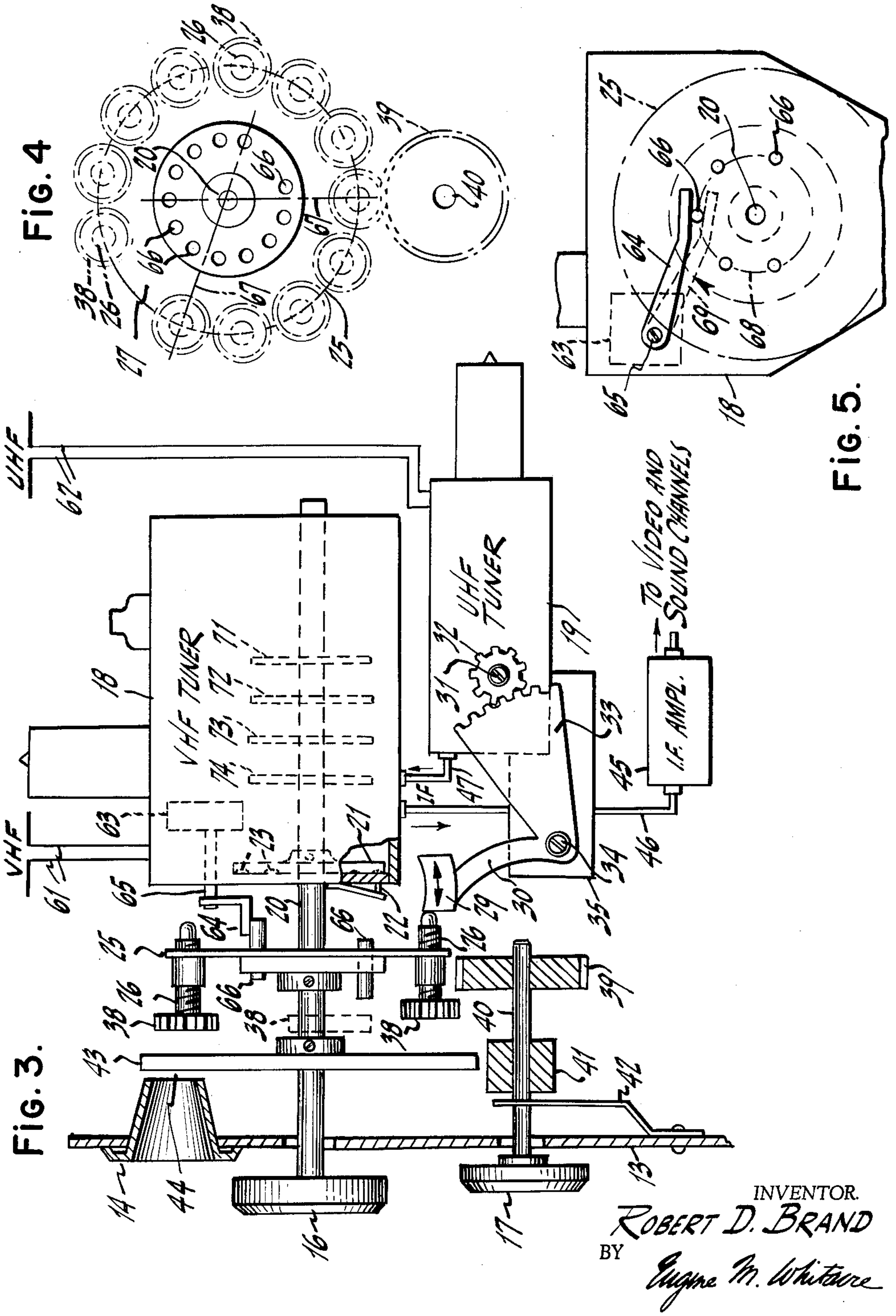
FIGURE 3 is an enlarged side view, partly in section, of the tuner switching system of the receiver of FIGURES 1 and 2, taken on the section line 3—3 of FIGURE 1 and showing the operational arrangement and circuit connections thereof.
FIGURES 4 and 5 are fragmentary front end views in elevation, of portions of the tuner mechanism of FIGURE 3 showing certain features thereof.

Referring now to FIGURES 2 and 3, along with FIGURE 1, it will be seen that the tuning system of the television receiver, in rear of the control panel 13, includes a VHF or lower frequency-band tuner 18 and a UHF or higher frequency-band tuner 19 suitably positioned and mounted with respect to each other whereby they may be incorporated into a unitary VHF and UHF or two-band tuning system for control and operation by the VHF tuner knob 16.

The VHF or lower-frequency tuner, as indicated, may be of the usual detent-controlled multi-stop rotary type for channel selection wherein the signal selecting circuits are preset tuned to preselected television broadcast channels, such as Channels 2–13 of the present VHF television band. Thus, the VHF tuner of the present example is provided with a tuning control shaft 20 which extends therethrough and is rotatable through one full 360-degree turn in thirteen equally-spaced steps or angular stop positions for these channels and one additional inactive position.

To establish the stop positions, resilient detent means is provided in connection with the tuning shaft. This may comprise, by way of example, a rotating detent disc 21 attached to the shaft and with which there is provided a fixed spring-pressed detent element 22 operable in connection with corresponding spaced detent notches 23 in the disc as indicated. The detent means shown represents any suitable means of this type for resiliently stopping and holding the tuning shaft of the VHF tuner at the channel tuning stops or positions and the additional position.

Fine tuning or AFC control means may also be provided if desired. In some instances, such as for UHF color reception, it may be desirable to use AFC to improve the resetting of the preset UHF channels. AFC may also be used with the VHF tuner to eliminate the need for a fine tuning lever and the other fine tuning elements. Therefore the VHF tuner may be considered to be preset to the VHF or selected channels for signal reception in the lower band, with or without fine tuning or AFC, as desired.

The UHF tuner is provided with a corresponding 13-position adjustable operating means comprising a rotary turret 25 which is connected with the VHF tuning shaft 20 and, in the present example, directly mounted thereon between the VHF tuner and the control panel 13. This carries 12 rotatable tuning adjustment screws 26 extending through the turret in a circular row near the periphery thereof and angularly spaced in parallel relation to each other, as indicated further in FIGURE 4 to which attention is also directed. The row of tuning screws includes a blank or additional position 27 corresponding to that of the VHF tuner.

As the turret 25 rotates in connection with the VHF tuner shaft 20 to the various tuning positions under control of the tuning knob 16 for the VHF tuner and its detent means, the tips of the tuning screws 26 progressively come in contact with the curved end 29 of a tuning control lever 30 for the UHF or high-frequency tuner. This tuner in the present example is a rotary continuously tunable or variable type having an operating or tuning shaft 21 on which is mounted a pinion gear 32 driven by a movable gear segment 33. The gear segment is mounted to move about a pivot pin 34 on a fixed bracket 35 and is connected with the tuning arm or lever 30, being integral therewith as indicated. The tuning lever is spring pressed to move to the left as viewed in the drawing, and is positioned by the tuning screws to move the UHF tuner to predetermined stop positions in its tuning range.

The heads 38 of the tuning screws 26 are pinion gears which are turned clockwise or counter-clockwise by a tuning gear 39 to move each of the screws in or out with respect to the end 29 of the tuning lever, and set or adjust the tuning of the UHF channels at each stop position of the VHF tuner. The tuning gear is mounted on a rotatable and longitudinally-movable control shaft 40 which passes through a fixed guide bearing 41 and the front panel 13 into connection with the tuning knob 17. The knob and gear may be moved axially to the front against the holding force of centering means, such as a flat spring element 42 connected with the shaft, to bring the gear 30 into mesh with and to rotate the pinion gears as they come into position at the successive stops for presetting the tuning of each UHF channel.

All of the tuning adjustment elements or screws are not shown in FIGURE 3, for more clearly showing other features therein. However, in FIGURE 4 it will be seen that these are equally spaced in a concentric circle about the turret axis, each with its pinion gear head. The gear heads thus project radially from the turret into a common circular path in which they move to mesh with the gear 39 for UHF preset tuning as above described. It will further be seen that the tuners are effectively mechanically linked or connected by tuning control means which provides for moving the UHF tuner to different channel tuning positions simultaneously with rotation of the VHF tuner to each of its detent-controlled channel tuning stop positions.

A common tuning dial 43 may be provided on the tuner shaft 20 to indicate the VHF and UHF channel setting. For this purpose it is in the form of a circular disc, the forward or dial face 44 of which moves past the tuning indicator window in the escutcheon 14. The channel tuning stops for both bands are determined by the VHF tuner detent means. Thus it controls the operating means or turret 25 for the UHF tuner in the present example which, like the tuner dial, is carried by the VHF tuner shaft, although either or both of these elements may be otherwise connected for operation thereby if desired. At each tuning stop, therefore, the UHF tuner is further moved or adjusted by the tuning screws to the UHF channel desired for insertion in the VHF channel tuning sequence at that point, and the indicia on the dial is changed accordingly.

The mechanical link or tuning control connection for the two tuners with the control knobs 16 and 17 is indicated in the circuit diagram by the dotted line connection 36. Also as indicated in both FIGURES 2 and 3, the VHF tuner is connected to apply its IF output signals to the IF amplifier 45 through an output connection indicated at 46. The VHF tuner likewise is connected to receive IF output signals from the UHF tuner through a signal input connection therewith indicated at 47. The IF signal output from the UHF tuner is translated or amplified in the VHF tuner when connected as an IF amplifier and applied to the output connection 46 and the IF amplifier 45, as will hereinafter be described.

Following the IF amplifier 45, the remainder of the television receiver circuitry, in accordance with present commercial practice and by way of example, includes a suitable video detector 49 which, in turn, is connected to a video amplifier 50. The output circuit 51 of the video amplifier is connected to the kinescope or picture tube 11 and from this circuit signals are also applied to a sync separator 52 and AGC circuits 53 for the receiver. The sync separator is connected to the horizontal and vertical deflection circuits 54 which drive the yoke 55 of the kinescope. The output control voltage from the AGC circuit 53 is connected through an AGC control circuit 57 to the IF amplifier 45 and the two tuners in the usual manner for automatic gain control. The sound channel circuits 59 of the receiver are also connected to the output circuit 51 of the video amplifier and drive the usual loud speaker or sound reproducing means 60, which is located behind the grille 12 in the present example.

Signal input to the two tuners 18 and 19 is made from suitable signal supply means or antennas 61 and 62, respectively, and the IF signal output from both tuners is through the VHF tuner and the output connection 46 to the IF amplifier. The VHF tuner is switched to the amplifying condition by suitable two-position switching means 63 internally thereof and control means therefor terminating externally of the tuner in a two-position operating element such as a cam or lever arm 64, in the present example, connected with an operating shaft 65 for the switch means.

The motion required for switching the tuner, that is, operating the switch element or lever 64 in the present example, may be provided by any suitable means connected with the VHF tuner shaft, thereby to be actuated in step with the detented stop positions thereof. By this means the VHF tuner switching is effected to interpose desired preset UHF signal channels at any or all of the VHF channel tuning stop positions, and the switching operation is effectively programmed into the VHF channel tuning sequence at normally inactive VHF tuning stops.

Referring particularly to FIGURES 3, 4 and 5, there is shown integral with the turret 25 a suitable switch operating or programming means. This includes two-position programming cams or pins 66, one coinciding with and presently diametrically opposite each tuning screw as indicated in FIGURE 4 by the dash lines 67, and arranged in a similar circular path for movement in step therewith into engagement with the switch lever 64, as indicated in FIGURE 5 to operate the VHF-UHF switch means 63. The programming pins can be pushed in to engage and operate the switch cam or lever as they move into the stop positions, or they may be left out so they move clear of the lever as indicated by the two examples shown in FIGURE 3, others of the pins not being shown in FIGURE 3 for clarity.

The switch lever 64 is spring loaded so that it presses against the programming pins as they move in a circular path indicated at 68 in FIGURE 5, and move the lever from its VHF tuning or normal position 69, as shown in dotted lines, to its UHF or IF amplifier position as shown in full lines. Only the pins which are pushed in serve to operate the switch and these are selected for the unused or inactive VHF channel stops or positions at which it is desired to interpose preselected UHF channel signals. The angular orientation of a programming pin or cam element with respect to its corresponding tuning screw is unimportant as long as there is one pin or element for each tuning screw, and with the same angular spacing.

Figure 6:
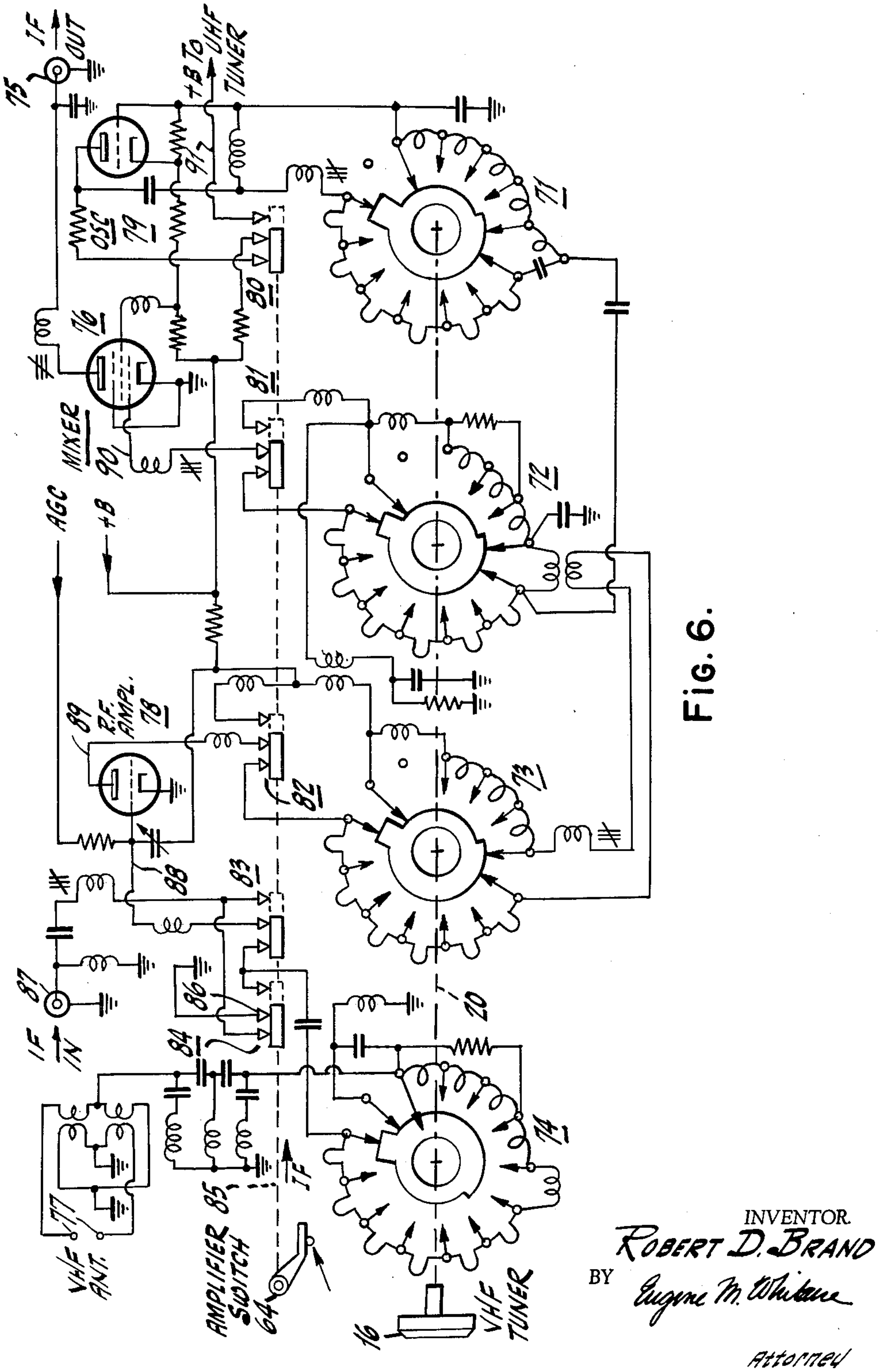
FIGURE 6 is a schematic circuit diagram of the VHF tuner shown in the preceding figures of the drawings, illustrating the internal circuitry and operation thereof.

The VHF tuner in the present example is of the four-circuit type for channel tuning, and includes four switch elements for this purpose as indicated at 71, 72, 73 and 74 in FIGURE 3, and also as shown in the VHF tuner circuit diagram of FIGURE 6 to which attention is now directed along with preceding figures. These switch elements are connected respectively in the oscillator, mixer, RF amplifier, and signal input circuits as will be seen. The switch elements 71–74, of the rotary sector type with interposed tuning inductors, are gang-connected with the tuning selector knob 16 through the tuner shaft 20, and provide for twelve channel tuning positions and one inactive position, corresponding to the detent stop positions.

The tuner is connected, as shown in FIGURE 6, to normally provide for VHF-band signal reception and IF signal output. This output is taken at terminal means 75 from the mixer stage 76, in response to VHF-band signals applied at antenna terminals 77 through the RF amplifier stage 78, and signals from the oscillator stage 79 coupled with the mixer stage. The selected VHF band signals are thus applied to the IF amplifier 45 and thence to the remainder of the television system as described in connection with the circuit of FIGURE 2. Under this condition of operation, the circuit switching means 63, for IF amplifier operation of the VHF tuner, is in the normal VHF tuning position.

The circuit switching in the VHF tuner for IF amplifier operation may be simplified, as shown in the present example, to include only five single-pole double-throw switch elements 80, 81, 82, 83, and 84 ganged for operation by the single cam or lever arm 64 through the operating shaft 65 or other connecting means as indicated by the dotted connection line 85 in FIGURE 6.

In the present example, movement of the cam or operating lever 64 by one of the operating elements 66 as in FIGURE 5, serves to move the switch elements 80–84, which are of the sliding contact type, from the full line positions as shown to the dotted positions, in unison. This serves through the switch elements 83 and 84, to switch the signal input from the VHF antenna or terminals 77 to IF signal input terminal means 87 at the grid circuit 88 of the RF amplifier 78. The switch element 84 provides a grounding contact 86 for the unused input circuit. The RF amplifier plate circuit 89, in connection with the tuning circuits of the switch section 73, is changed from RF to IF operation through the switch element 82 of the amplfier switching means. Likewise, the mixer grid circuit 90 is switched from RF to IF operation, in connection with the circuits of the tuner switch section 72, through the amplifier switch element 81, as indicated.

The positive operating current or +B circuit is switched from the VHF oscillator 79 to the UHF tuner 19 through an output circuit connection indicated by the lead 91 in FIGURE 6, which also appears as a circuit connection in FIGURE 2. This switching operation is performed by the amplifier switch section 80, as indicated, and serves to deenergize the UHF tuner during VHF tuning operations, and to de-energize the VHF oscillator 79 during UHF tuning operations, when the VHF tuner becomes an IF amplifier or preamplifier for increased signal gain and selectivity in the higher frequency tuning band.

From the foregoing description, it will be seen that a tuner switching system for use in a VHF-UHF type of television receiver, in accordance with the invention, provides that at any VHF channel tuning stop position, the VHF tuner may be switched to provide an IF or like amplifying function for the UHF tuner which, at that stop position, may be set or preset for a desired UHF channel, thereby to use free or otherwise unused VHF channel tuning stop positions for UHF signal reception. This system thus simplifies the tuning set up and operation of the receiver through the multi-channel signal selection provided by the two bands.

Thus two tuners are used in the present example, one lower-frequency or VHF tuner being of the rotary preset channel type with detented channel tuning stops, and the other UHF or higher-frequency tuner being mechanically linked or connected for tuning stop positioning jointly with the lower-frequency or VHF tuner. Thus, the tuners are mechanically linked or connected for joint operation or movement and under detent stop control of the VHF or lower-frequency tuner, whereby at each detented VHF channel tuning stop position, the UHF or higher-frequency tuner is also automatically stopped, that is, provided with a tuning stop position.

At each of these predetermined or preset stop positions, the UHF tuner may then be preset tuned for a desired UHF channel signal to be interposed in the VHF tuning sequence at that stop position. Preset means for this purpose is provided in the mechanical link between the VHF or lower-frequency tuner and the UHF or higher-frequency tuner, and may include adjustable tuning-screw or like turret means ganged or otherwise connected with the lower-frequency tuner and detenting means. The VHF or lower-frequency tuner is adapted to be switched to IF amplifier operation at any lower-frequency tuning stop by the two-position switching circuit therein. Either the IF amplifier position or the VHF or lower-frequency channel tuning position of the switching circuit may be selected.

The switching action can be programmed with the tuning operation for selection at each detented tuning stop of the VHF or lower frequency tuner, and controlled by means responsive to movement of the VHF or lower-frequency tuner to each stop position for selecting the operating condition thereof. Switching of the VHF or lower-frequency tuner-amplifier in a two-band receiver may thus be made to program the VHF or UHF preset channel selection at each preset tuning stop in the rotary tuning sequence.

What is claimed is:

1. The combination with a television band tuner of the rotary preset channel type responsive to signals in one television band, of:

means for switching said tuner to provide signal translation therethrough in response to signals in a second television band, and adjustable programming means for programming said switching means to operate at a variety of predetermined channel tuning stops of said tuner, thereby to provide for substituting signals in the second television band in place of first television band signals in the tuning sequence for the first television band.

2. The combination with a television band tuner of the rotary preset channel type having channel tuning stops and circuits for signal reception in the very-high-frequency television broadcast band, of:

a second television tuner operable in the ultra-high-frequency television broadcast band, means for switching said first tuner circuits to provide signal translation therethrough as an intermediate-frequency amplifier for the second tuner, means for presetting said second tuner to predetermined signal channels in the ultra-high-frequency band at selected tuning stops of said first-named tuner, and adjustable programming means for presetting said television band tuner for translating one of said very-high-frequency and ultra-high-frequency bands at said channel tuning stops, said adjustable programming means being operable to actuate said switching means at selected channel tuning stops, thereby to provide for interposing signals in the ultra-high-frequency band in an adjustable arrangement in the tuning sequence for the very-high-frequency band.

3. The combination with a first television band tuner of the rotary preset channel type responsive to signals in a lower-frequency television band, of:

a second television band tuner of the continuous tuning type responsive to signals in a higher frequency band, means for operating said tuners jointly to predetermined stop positions in the tuning sequence of the first tuner, means for setting the tuning of said second tuner for response to selected signal channels in the higher-frequency band at selected ones of said stop positions, means for switching said first tuner to provide signal translation therethrough from the second tuner, and adjustable programming means for programming said switching means to operate at said selected ones of the stop positions, thereby to provide for interposing selected signal channels at various stop positions throughout the second television band in the channel tuning sequence of the first television band.

4. The combination with a first lower-frequency television band tuner of the preset channel type having a rotary tuning control shaft with detented tuning stop positions, of:

a second high-frequency television band tuner of the continuous tuning type, means including a rotary tuning turret on said control shaft for operating said second tuner to predetermined stop positions in the tuning sequence of the first tuner, means on said turret for setting the tuning of said second tuner for response to selected signal channels in the higher-frequency band at selected ones of said stop positions, means for switching said first tuner to provide intermediate-frequency amplifier means for said second tuner, and adjustable programming means for programming said switching means to operate at said selected ones of the stop positions, thereby to provide for substituting selected signal channels in the second television band in the channel tuning sequence of the first television band.

5. In a two-band television receiver, the combination with first a variable ultra-high frequency tuner and a second very-high-frequency channel tuner having a rotary tuning control shaft with detent-controlled tuning stops in a channel tuning sequence, of:

rotary tuning turret means connected with said shaft for joint tuning operation of said first tuner in unison with said second tuner to said stops, means connected with said first tuner for presetting the tuning thereof to a predetermined signal channel at each of said stops, means for switching said second tuner for translating the signal output from the first tuner, and adjustable preset means for selectively actuating said switching means at said stops to interpose preset channel signals from the first tuner at various stops throughout the tuning sequence of the second tuner.

6. In a two-band television receiver, the combination with a higher-frequency variable tuner and a lower-frequency rotary channel tuner having a plurality of detent-controlled tuning stop positions in a channel tuning sequency, of:

means mechanically linking said tuners for joint tuning operation in unison to said controlled stop positions, means connected with said higher-frequency tuner for presetting the tuning thereof to a predetermined signal channel at each of said stop positions, an intermediate-frequency amplifier connected to receive the signal output of said lower-frequency tuner directly therefrom and the signal output from the higher-frequency tuner through said lower-frequency tuner, means for switching said lower-frequency tuner for translating therethrough the signal output from the higher-frequency tuner to said amplifier, and adjustable preset means for selectively actuating said switching means at any of said stop positions in said lower-frequency channel tuning sequence to interpose preset channel signals from the higher-frequency tuner in said tuning sequence.

7. In a two-band television receiver, an improved tuner switching system, comprising in combination:

a first lower-frequency rotary tuner with detented channel tuning stops in a preset channel tuning sequence, a second higher-frequency tuner mechanically-connected with said first tuner for channel tuning stop positioning jointly therewith, means for presetting the second tuner for higher-frequency signal channels to be interposed in the lower-frequency tuning sequence, means for applying output signals from the higher-frequency tuner to the lower-frequency tuner as signal amplifier and translating means therefor, means for switching said lower-frequency tuner to provide signal translation and amplification for said applied signals, and adjustable preset means for selectively actuating said switching means at any of said tuning stops, thereby to program lower-frequency and higher-frequency signal reception by said receiver at each of the stops in said tuning sequence.

8. In a two-band television receiver, a tuner switching system, comprising in combination:

a first very-high-frequency tuner of the rotary preset channel type with detented channel tuning stops, a second ultra-high-frequency tuner mechanically connected with said first tuner for channel tuning stop positioning jointly therewith, means for presetting the second tuner for response to selected signal channels in the ultra-high-frequency band, means for switching the first tuner to provide an amplifier for signals in said selected ultra-high-frequency channels, and means for selectively actuating said switching means at each of said tuning stops, said last named means including, an operating lever on said switching means, a rotary tuning turret connected and rotatable with the first tuner to said stops, and movable two-position cam elements carried by said turret and operative in one position at each stop to engage said operating lever and actuate said switching means.

9. In a television receiver, the combination with a higher-frequency tuner and a lower-frequency tuner covering two television broadcast signal bands, said lower-frequency tuner being of the rotary channel-tuning type having a plurality of detent-controlled tuning stop positions, of an improved tuner switching system therefor comprising:

means providing a mechanical connection between said tuners whereby said tuners are operated and stopped in unison, means for presetting the tuning of the higher-frequency tuner for predetermined channel response at said stop positions, means for selectively switching the lower-frequency tuner to provide amplification for output signals from said higher-frequency tuner, and means for programming said switching means to be actuated selectively at any of said tuning stop positions.

10. A television tuner switching system, comprising in combination:

an ultra-high-frequency tuner covering a plurality of higher-frequency television broadcast channels, a rotary very-high-frequency tuner covering a plurality of lower-frequency television broadcast channels, said last named tuner having circuit elements and two-position switching means operable to convert the tuner for intermediate-frequency signal amplification, means providing a circuit connection between said tuners for translating intermediate-frequency signal output from the ultra-high-frequency tuner to the very-high-frequency tuner, means for rotating said last named tuner through a channel tuning sequence at predetermined stop positions, and means selectable to operate said switching mans at any of said stop positions, thereby to interpose ultra-high-frequency signals in the very-high-frequency tuning sequence.

11. A tuner switching system for use in a two-band television receiver comprising:

lower-frequency and higher-frequency tuners, said lower-frequency tuner being of the rotary preset channel tuning type having a plurality of detent channel stop positions in a predetermined sequence, said higher-frequency tuner being mechanically connected with the lower-frequency tuner for tuning stop positioning jointly therewith at predetermined stop positions in said sequence, means in said mechanical connection for presetting the channel tuning of the higher-frequency tuner at each of said predetermined stop positions, means for switching said lower-frequency tuner to provide signal amplification for the higher-frequency tuner, and means including a movable switch lever and a plurality of two-position cam elements for selectively actuating said switching means at each of said predetermined stop positions, thereby to interpose higher-frequency signals in the lower-frequency channel tuning sequence.

12. In a two-band television receiver, the combination with a first lower-frequency tuner of the rotary channel tuning type having a plurality of channel tuning stop positions in a multi-channel tuning sequence, of:

an intermediate-frequency amplifier connected for receiving the intermediate-frequency signal output of said tuner, a second higher-frequency tuner connected to operate under control of said first tuner to the same tuning stop positions for joint channel tuning operation to any frequency in the higher-frequency band of said receiver at each stop position, said second tuner having an intermediate-frequency signal output circuit connected to said intermediate-frequency amplifier through said first tuner, and means for selectively switching said first tuner at predetermined tuning stop positions to provide intermediate-frequency signal amplification and translation between the second tuner and the intermediate-frequency amplifier, thereby to interpose preselected higher-frequency channel signals in the channel tuning sequence of the lower-frequency tuner.

13. In a two-band television receiver, the combination with a very-high-frequency tuner of the rotary channel tuning type having resilient detent means for establishing a plurality of channel tuning stop positions therefor and rotary channel tuning control means and circuits for adjusting the tuner for multi-channel reception in the very-high-frequency band at said stop positions, of:

an associated ultra-high-frequency tuner having a movable tuning control element connected to be moved in unison with the very-high-frequency tuner to said stop positions, means providing a switching circuit in the very-high-frequency tuner for selecting alternative signal-translating amplifier operation therefor in connection with the ultra-high frequency tuner, said switching circuit including a two-position control switch having a movable operating element, and programming means responsive to the operation of the very-high-frequency tuner to selected stop positions thereof for operating said control switch, said last named means including a plurality of two-position movable actuating elements for the switching operating element corresponding in number and angular spacing to said tuning stop positions.

14. The combination with a television band tuner of the rotary preset channel type responsive to signals in one television band, of:

means for switching said tuner to provide signal translation therethrough in response to signals in a second television band, means for programming said switching means to operate at different predetermined channel tuning stops of said tuner, thereby to provide for interposing signals in the second television band in the tuning sequence for the first television band, a second television band tuner of the variable tuning type responsive to signals in said second television band and connected to apply output signals to the first television band tuner through said switching means, means mechanically connecting said tuners for joint operating movement under control of the preset channel tuning stops of the first tuner, thereby to provide channel tuning stop positions for the second tuner at each of the channel tuning stops of the first named tuner, and means for further adjusting the tuning of the second tuner at each of said channel stop positions to preselected signal channels in the second television band, thereby to insert said preselected signal channels in the preset channel tuning sequence of the first tuner in the first television band at each of said predetermined positions.

15. In a two-band television receiver, the combination with a very-high-frequency television band tuner of the rotary preset channel type having detented channel tuning stop positions and an ultra-frequency television band tuner mechanically connected for joint operational movement with said first tuner and under detent stop control thereof, of means providing a signal circuit connection between said tuners for applying output signals from the ultra-high-frequency tuner to the very-high-frequency tuner, circuit means in the very-high-frequency tuner for signal tuning and translation in a plurality of preselected channels, means for switching said circuit means for translating signals applied thereto from the ultra-high-frequency tuner, means for setting the tuning of said ultra-high-frequency tuner for response to a predetermined ultra-high-frequency channel at each of said tuning stops, and programming control means responsive to operation of said very-high-frequency tuner at selected ones of said tuning stop positions, for selectively operating said switching means to provide ultra-high-frequency signal translation through said very-high-frequency tuner, and thereby to interpose ultra-high-frequency channel signals in the very-high-frequency tuning sequence at said selected stop positions.

16. A tuning system for tuning throughout the very high frequency and the ultra high frequency television bands comprising:

a step-by-step preset very high frequency tuner having a rotary tuning control shaft with a plurality of detented tuning stop positions;

a continuously tunable ultra high frequency tuner;

a rotary turret connected to rotate with said control shaft;

means on said turret for the preset tuning of said ultra high frequency tuner to selected ultra high frequency channels at said tuning stop positions;

means for switching said very high frequency tuner to provide intermediate frequency amplifier means for said ultra high frequency tuner, and adjustable programming means on said control shaft for operating said switching means to substitute ultra high frequency channel reception in a selectable sequence at said very high frequency tuning stop positions to provide for preset tuning of selected channels in both the very high frequency and the ultra high frequency television bands.

References Cited by the Examiner

UNITED STATES PATENTS

| | | | |
|---|---|---|---|
| 2,810,827 | 10/1957 | Nordby | 325—461 |
| 2,821,624 | 1/1958 | Koch | 325—455 |
| 2,873,610 | 2/1959 | Williams | 334—1 |

DAVID G. REDINBAUGH, *Primary Examiner*